US012707696B2

(12) United States Patent
Roy et al.

(10) Patent No.: US 12,707,696 B2
(45) Date of Patent: Aug. 11, 2026

(54) METHOD FOR MANUFACTURING A CONTACT ON A SILICON CARBIDE SEMICONDUCTOR SUBSTRATE, AND SILICON CARBIDE SEMICONDUCTOR DEVICE

(71) Applicant: Infineon Technologies AG, Neubiberg (DE)

(72) Inventors: Saurabh Roy, Villach (AT); Ravi Keshav Joshi, Klagenfurt am Wörthersee (AT); Hans-Joachim Schulze, Taufkirchen (DE); Bernhard Goller, Villach (AT); Daria Krasnozhon, Villach (AT)

(73) Assignee: Infineon Technologies AG, Neubiberg (DE)

( * ) Notice: Subject to any disclaimer, the term of this patent is extended or adjusted under 35 U.S.C. 154(b) by 486 days.

(21) Appl. No.: 18/225,030

(22) Filed: Jul. 21, 2023

(65) Prior Publication Data

US 2024/0030032 A1 Jan. 25, 2024

(30) Foreign Application Priority Data

Jul. 22, 2022 (DE) ......................... 102022207524.2

(51) Int. Cl.
*H01L 21/04* (2006.01)
*H10D 62/832* (2025.01)
(Continued)

(52) U.S. Cl.
CPC ..... *H10D 64/0115* (2026.01); *H10D 62/8325* (2025.01); *H10D 64/62* (2025.01); *H10P 34/42* (2026.01)

(58) Field of Classification Search
CPC ... H01L 21/0485; H01L 21/268; H10D 64/62; H10D 62/8325
See application file for complete search history.

(56) References Cited

U.S. PATENT DOCUMENTS

2013/0062622 A1* 3/2013 Tsuchiya .............. H10D 62/405 257/E21.409
2019/0362972 A1* 11/2019 Schulze .................. H01L 21/78
(Continued)

FOREIGN PATENT DOCUMENTS

DE 102022114411 A1 1/2023
JP 2009049198 A 3/2009

OTHER PUBLICATIONS

Yue Cheng, et al.; Fabrication of Ohmic contact on semiinsulating 4H-SiC substrate by laser thermal annealing; Journal of Applied Physics 119, 225705 (2016); Jun. 13, 2016; 7 Pgs.
(Continued)

*Primary Examiner* — William C Trapanese
(74) *Attorney, Agent, or Firm* — Cooper Legal Group LLC

(57) ABSTRACT

The present disclosure generally relates to a method of manufacturing a contact on a silicon carbide semiconductor substrate wherein the method comprises providing a 4H—SiC semiconductor substrate, irradiating a surface area of the 4H—SiC semiconductor substrate with a first thermal annealing laser beam, thereby generating a phase separation of the surface area comprising at least a 3C—SiC layer, and depositing a contact material onto the 3C—SiC layer to form a contact layer on the semiconductor substrate. The disclosure further relates to a silicon carbide semiconductor device with an Ohmic contact comprising a 4H—SiC semiconductor substrate, a 3C—SiC layer, and a contact layer directly in contact with the 3C—SiC layer at the semiconductor surface.

20 Claims, 2 Drawing Sheets

(51) Int. Cl.

| | |
|---|---|
| ***H10D 64/01*** | (2025.01) |
| ***H10D 64/62*** | (2025.01) |
| ***H10P 34/42*** | (2026.01) |

(56) References Cited

U.S. PATENT DOCUMENTS

2019/0371893 A1* 12/2019 Iguchi ...................... H10D 8/60
2023/0024105 A1* 1/2023 Schustereder ..... H10D 62/8325
2023/0215729 A1* 7/2023 Schulze .............. H01L 21/0485
257/64

OTHER PUBLICATIONS

Nishimura, et al.; Nuclear Instruments and Methods in Physics Research B; Electrical and structural properties of polycrystalline 3C-SiC layer regrown from amorphized 4H-SiC(0 0 0 1) by P and Al ion implantations; 4 Pgs.; http://www.elsevier.com/locate/nimb.

Choi, et al.; Laser-induced Phase Separation of Silicon Carbide; Nature Communications; Nov. 30, 2016; 7 Pgs.

* cited by examiner

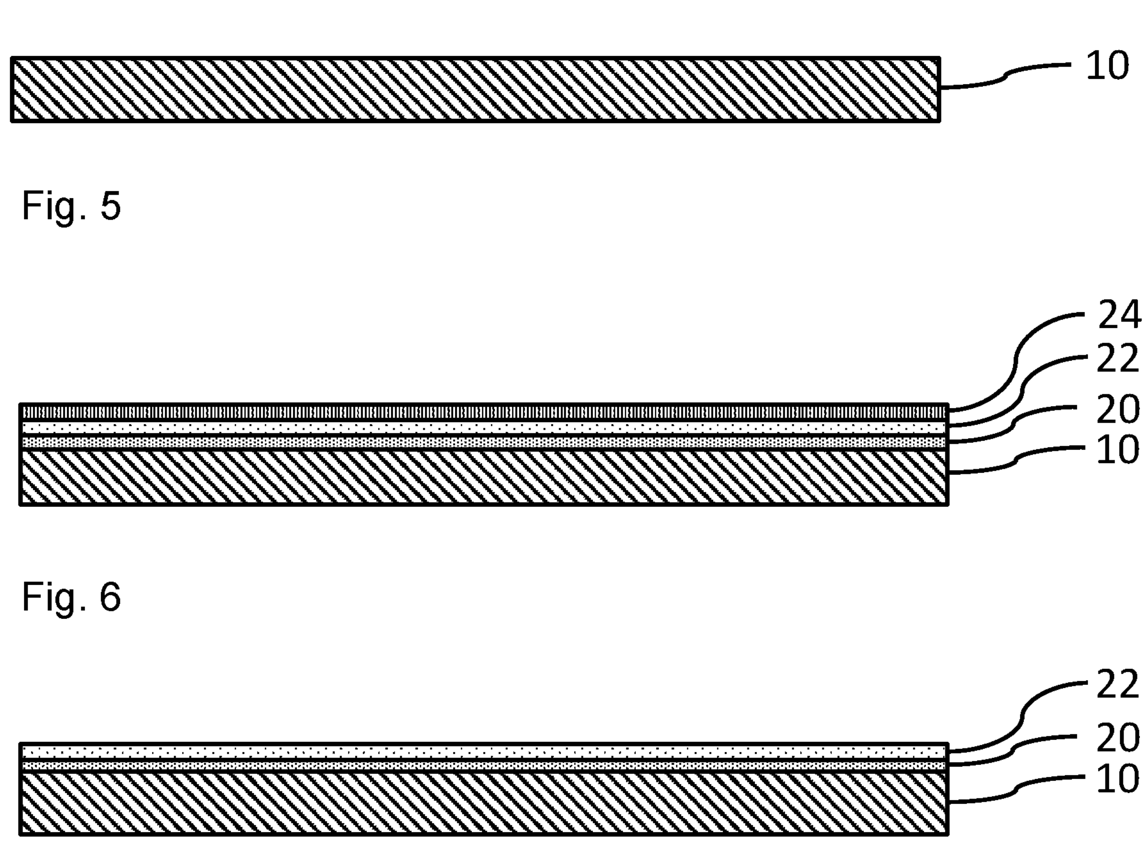
Fig. 5
Fig. 6
Fig. 7
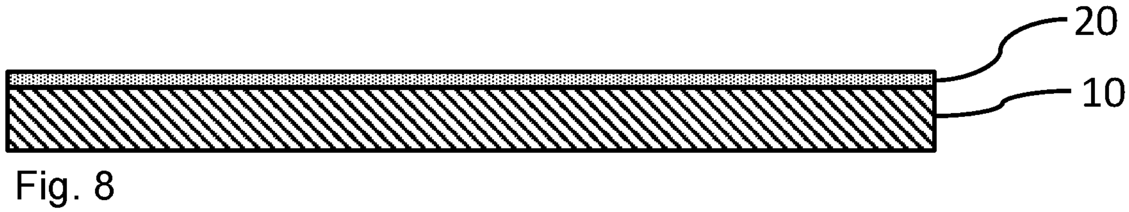
Fig. 8
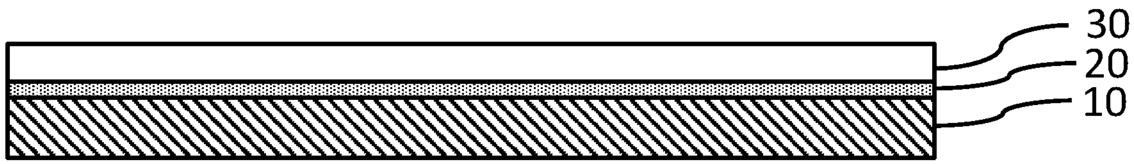
Fig. 9

METHOD FOR MANUFACTURING A CONTACT ON A SILICON CARBIDE SEMICONDUCTOR SUBSTRATE, AND SILICON CARBIDE SEMICONDUCTOR DEVICE

RELATED APPLICATION

This application claims priority to German Patent Application No. 102022207524.2, filed on Jul. 22, 2022, entitled "METHOD FOR MANUFACTURING A CONTACT ON A SILICON CARBIDE SEMICONDUCTOR SUBSTRATE, AND SILICON CARBIDE SEMICONDUCTOR DEVICE", which is incorporated by reference herein in its entirety.

TECHNICAL FIELD

The present disclosure generally relates to methods for manufacturing a contact on a silicon carbide semiconductor substrate, and a silicon carbide semiconductor device with an Ohmic contact which, among others, is obtainable by the herein described methods.

BACKGROUND

Semiconductor devices having wide bandgap properties such as silicon carbide (SiC) based diodes or power MOSFETs are considered as the next generation electronic devices, for example in applications in harsh environments or in the power electronics area. In the development of such semiconductor devices, one aspect is the creation of Ohmic contacts between the semiconductor material and the metal layer stack above the semiconductor substrate surface. Especially, the creation of back-side Ohmic contacts for the archetypal 4H—SiC substrates which are extensively used across the industries becomes quite a challenge. Conventionally, Ni is used as a contact material or intermediate contact material, to make an Ohmic contact with the 4H—SiC polytype of the semiconductor substrate. However, under high temperature conditions it is found that NiSi along with carbon clusters and thin carbon films could be detected at the interface as byproducts.

Carbon may cause failures in adhesion between the metallic interlayers within the back-side metallization stacks. These failures in adhesion may cause peeling off the metallization in the next process acts or during the application of the semiconductor devices, especially in high temperature environments or under high power conditions.

In the light of the above, there is a demand to provide alternative manufacturing processes for an Ohmic contact on SiC based semiconductor substrates, which enable the production of an Ohmic contact in an efficient and cost sensitive manner. Furthermore, there is a need of providing SiC based semiconductor devices having reliable Ohmic contacts providing stability and a high performance during their uses.

SUMMARY

Some embodiments relate to a method for manufacturing a contact on a silicon carbide semiconductor substrate, wherein the method may comprise providing a 4H—SiC semiconductor substrate, irradiating a surface area of the 4H—SiC semiconductor substrate with a first thermal annealing laser beam, thereby generating a phase separation of the surface area comprising at least a 3C—SiC layer, and/or depositing a contact material onto the 3C—SiC layer to form a contact layer on the semiconductor substrate. The substrate may be a monocrystalline substrate, based on, for example, 4H—SiC crystalline structures. However, other polytype regions such as 6H—SiC regions may be comprised as well within the substrate, while the 4H—SiC monocrystalline substrates may be used in the production of MOSFETs, J-FETs, and/or diodes. Therefore, in the following description, 4H—SiC is used for explaining the technical effects of the embodiments, while it shall not exclude other polytypes, especially other hexagonal monocrystalline polytypes.

The crystalline structure of the 4H—SiC semiconductor substrate may be modified at least in a surface region by irradiation with a first thermal annealing laser beam. Thermal annealing using laser beams with an adjusted energy density is sometimes also referred to as "LTA" (laser thermal annealing). In some embodiments, the surface area of the semiconductor substrate may be irradiated by a first LTA laser beam to generate a phase separation of the 4H—SiC monocrystalline substrate, and/or the energy density of the laser beam may be adjusted such that at least a thin cubic 3C—SiC layer is generated by the phase separation. The thickness of the 3C—SiC layer may be high enough to provide an Ohmic contact with the metallization layer to be provided thereon, for example. Carbon or silicon byproduct portions may be generated in this irradiation act as well. However, the 3C—SiC layer in the surface region of the semiconductor substrate obtainable or obtained by the herein described embodiments may be a crystalline or polycrystalline layer having a cubic structure which may be responsible for providing a reduced bandgap compared to the 4H—SiC polytypes. This may result in a lower contact resistance when being contacted by a metal contact layer.

According to some embodiments, the metal contact layer may be manufactured by depositing a contact material directly onto the 3C—SiC layer, thereby forming a contact layer on the semiconductor substrate. The metal used may be any metal in elemental form or any metal compound or metal mixture which forms a good Ohmic contact with silicon carbide, and/or also in presence with silicon and carbon portions, if any. The metal component may have a work function within the range of 3C—SiC polytype's electron affinity which may be exposed to the surface to be contacted, for example the backside of a semiconductor substrate. The herein presented embodiments may allow the formation of an Ohmic contact in an efficient and cost sensitive manner. Furthermore, the direct deposition of the metal contact material onto the 3C—SiC layer provided at the surface area of the semiconductor substrate may improve (e.g., increase) the reliability of the obtained Ohmic contact. Furthermore, the formation of silicide layers or an additional doping of the backside surface region of the semiconductor substrate as has been carried out in alternative manufacturing processes may not be required, while obtaining a very good Ohmic contact because of the 3C—SiC electron affinity similar to the work function of the contact metal material. Overall, the herein described method enables a low contact resistance and/or a good reproducibility and homogeneity of the contact resistance in the obtained semiconductor devices.

Even though this method may be used for contacting the back side (sometimes called rear side) and front side semiconductor surface with metal layers, it may be used for providing n-doped backside contacts. The terms "front side" and "backside" are used with reference to the orientation in the examples shown in the drawing section. Because components of embodiments can be positioned in a number of different orientations, the directional terminology is used for purposes of illustration only and shall in no way considered to be limiting.

Some embodiments relate to a method for manufacturing a contact on a silicon carbide semiconductor substrate, wherein the method may comprise providing a 4H—SiC semiconductor substrate, irradiating a surface area of the 4H—SiC semiconductor substrate with a first thermal annealing laser beam, thereby generating a phase separation of the surface area comprising at least a 3C—SiC layer with a silicon portion and a carbon portion, removing at least some of (e.g., at least most parts of) the silicon portion, removing at least some of (e.g., at least most parts of) the carbon portion, and/or depositing a contact material onto the 3C—SiC layer to form a contact layer on the 4H—SiC semiconductor substrate.

The substrate may be selected from those as defined in the previous embodiments described herein before. In the act of irradiating the surface area of the semiconductor substrate, the energy density of the first thermal annealing laser beam may be adjusted such that the phase separation of the 4H—SiC polytype in the surface area may generate a phase separation into at least a 3C—SiC layer. In this embodiment, some parts of the 4H—SiC layer may be further be decomposed into silicon and carbon, thus leading to silicon and carbon portions above or within the 3C—SiC-layer. The phase separation by LTA irradiation may lead to a layered stack in the order of a monocrystalline 4H—SiC layer, a 3C—SiC layer, a silicon layer, and a carbon layer. Therefore, some and/or most parts of the silicon and carbon portions generated by the phase separation may be removed by suitable mechanical or chemical removing processes, such as common etching process acts, before the contact material as in the former embodiments may be formed as a contact layer on the 3C—SiC layer which has been generated by phase separation in the surface area of the semiconductor substrate. Thus, the method may result in a contact layer bonding without excess carbon clusters which, otherwise, may lead to a bad adhesion between the layers, especially between the semiconductor substrate and the contact metal layer. Hence, the herewith described method results in reliable Ohmic contacts wherein the smaller bandgap of the 3C—SiC layer compared to the monocrystalline substrate material can be suitably used to reduce the contact resistance.

Further embodiments relate to silicon carbide semiconductor devices having a structure of at least three layers, namely a 4H—SiC semiconductor substrate layer, a 3C—SiC layer, and a contact material layer above the semiconductor substrate surface. Those semiconductor devices may have good Ohmic contacts due to a similar electron affinity of the 3C—SiC layer to the metallic contact layer. As carbon clusters can be avoided or their number can be significantly reduced during the manufacturing methods described herein, the adhesion of the metal contact layer may be improved compared to semiconductor devices in which the metal contact is provided on a phase separated 3C—SiC layer with subsequent silicon and carbon layers between the SiC layer and the metal contact layer. Moreover, the direct interface between the metal contact layer and the 3C—SiC layer including their surrounding parts do not need a silicidation act by, for example, an additional thermal annealing as in the NiSi contacting processes. Thus, an additional act can be avoided by this method. Moreover, the contact may be prepared on any 4H—SiC substrate with typical dopant concentrations and an additional implantation of dopants near the surface for improving the Ohmic contact may not be needed in the herein described methods. The contacts prepared by the herein described methods may provide a significant impact on the stability and performance of the generated semiconductor devices with good Ohmic contacts.

In this specification, the term "on" does mean that a layer or element may be directly on or extended directly onto another layer or element or intervening layers or elements may also be present. In contrast, when an element is referred to as being "directly on" or extending "directly onto" another element, there are no intervening elements present.

Of course, the present disclosure is not limited to the above features and advantages. Indeed, those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated examples can be combined unless they exclude each other. Examples are depicted in the drawings and are detailed in the description which follows.

FIG. 1 illustrates a cross-sectional view of a SiC substrate.

FIG. 2 illustrates a cross-sectional view of a SiC substrate with 3C—SiC layer in the surface region.

FIG. 3 illustrates a cross-sectional view of a SiC substrate with 3C—SiC layer in the surface region, on which a contact material layer is provided.

FIG. 5 illustrates a cross-sectional view of another SiC substrate.

FIG. 6 illustrates a cross-sectional view of the SiC substrate of FIG. 5 with a stack of a 3C—SiC layer, a silicon layer, and a carbon layer.

FIG. 7 illustrates a cross-sectional view of the SiC substrate of FIG. 6, wherein the carbon layer has been removed.

FIG. 8 illustrates a cross-sectional view of the SiC substrate of FIG. 7, wherein the silicon layer has been removed.

FIG. 9 illustrates a cross-sectional view of a semiconductor device with a contact material layer above the 3C—SiC layer of the SiC substrate as shown in FIG. 8.

DETAILED DESCRIPTION

Figure 4:
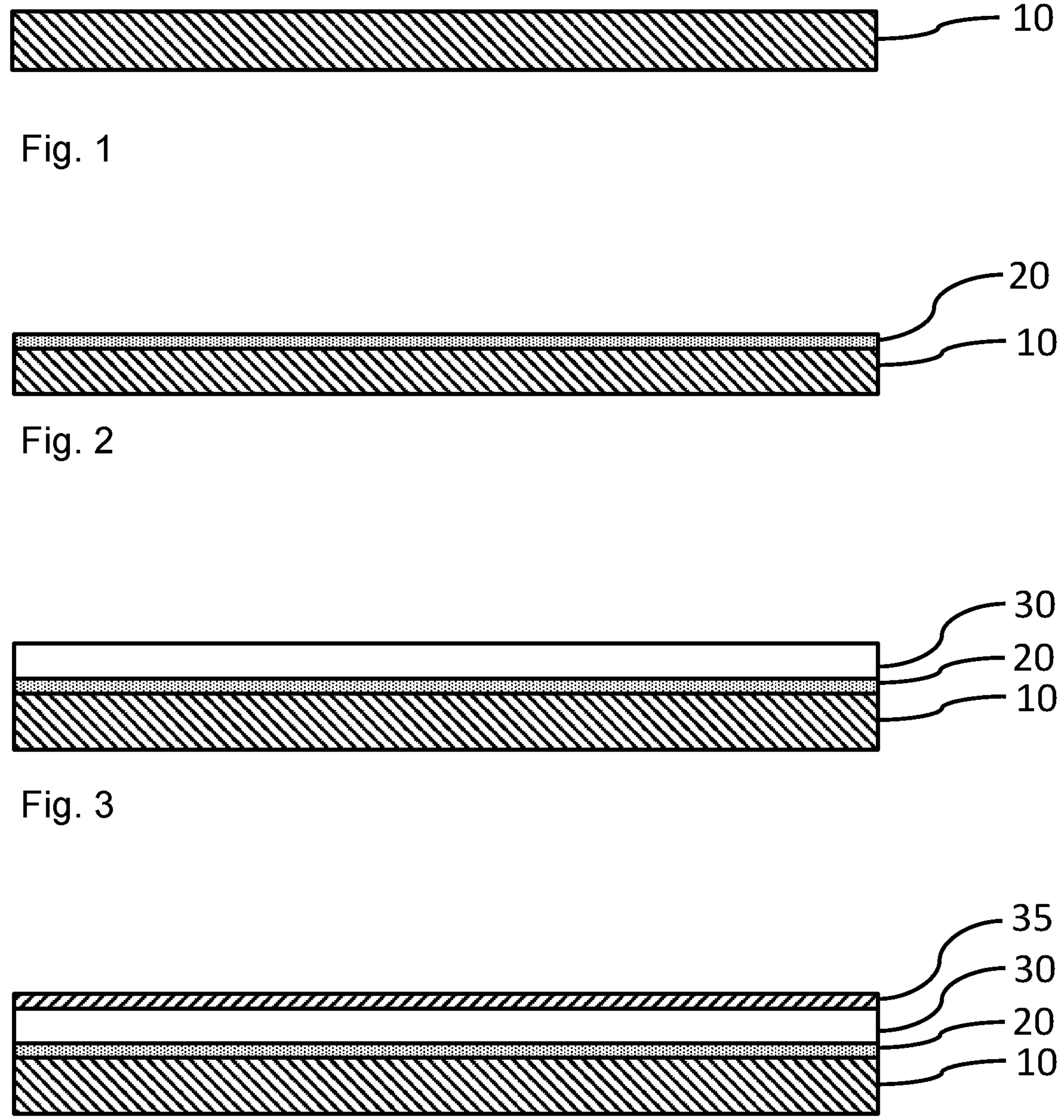
FIG. 4 illustrates a cross-sectional view of a SiC semiconductor device with a stack of a 3C—SiC layer, a contact material layer, and an additional metal layer above a 4H—SiC substrate.

Hereinafter, manufacturing processes for contacts on silicon carbide semiconductor substrates, which enable the production of Ohmic contacts in an efficient and cost sensitive manner are described in greater detail. The SiC based semiconductor substrates generally are silicon carbide work pieces to be processed. For example, the SiC based semiconductor substrate may be a SiC based wafer. The SiC based semiconductor substrate may, alternatively, comprise a base wafer (also called "growth substrate" or "growth wafer") onto which semiconductor layers are deposited, such as, for example, by using an epitaxial process. At least one epitaxial layer may adjoin a front side of the semiconductor substrate. In optional process acts, a metal contact layer may be provided on the SiC based semiconductor substrate. In this case, the SiC based semiconductor substrate may be a processed wafer. Exemplary processed wafers with a SiC based semiconductor substrate may comprise power MOSFETs, J-FETs, or diodes. Those SiC based electronic components, may have an n-doped SiC substrate layer at the backside of the semiconductor substrate to be contacted with a metal contact layer. At the front side of the semiconductor substrate, a p-doped semiconductor layer at the interface between the semiconductor substrate and the metal contact layer may be required for the formation of a p-body or a p-emitter. While emphasis is placed on manufacturing methods for Ohmic contacts at power MOSFET, J-FETs, or diode component parts, the embodiments and examples described herein are not intended to be limited to these specific electronic components. Instead, the methods can be used for manufacturing Ohmic contacts of any other electronic components based on a SiC substrate, for example epitaxial layers comprised by the SiC substrate. Moreover, the term "substrate" may include processed wafers comprising several epitaxial layers in which the growth substrate has been at least partially removed before the backside contact may be generated. In addition, the interface between the semiconductor substrate front side and/or backside and the metal layer and the regions close to this interface may be doped with other dopants. For example, n-doped layers at the front side or p-doped layers at the backside may also be selected depending on the electronic device produced. For each doping type "n" or "p", different doping concentrations can be used. Generally, these concentrations are identified as n− or p+, for example. In this specification, any doping type indicated herein may have the same or different absolute concentration than the same type in another embodiment or example. For the embodiments described herein, a dopant region in the substrate is not necessary. Thus, the substrates instead may be used without any doping layer at the side where the contact is to be prepared.

The semiconductor substrate and, if applicable, the epitaxial layers for these electronic devices may be monocrystalline. Exemplary embodiments of monocrystalline semiconductor materials are mostly based on 4H—SiC substrates. Thus, the first act may be providing a monocrystalline 4H—SiC substrate. A monocrystalline 6H—SiC substrate may also be used even though there is no example explicitly described herein. As described above, the substrate may comprise device structures within the substrate. Before the act of manufacturing the contact by depositing metal layers, further device structures may be produced within the base substrate. In addition, thickness reducing acts of the semiconductor substrate, if needed or intended, may be applied before the manufacturing of the contact.

In one embodiment, the method for manufacturing a contact on a SiC substrate further comprises the act of irradiating a surface region of the 4H—SiC semiconductor substrate with a first thermal annealing laser beam. The annealing, such as, for example, by using a thermal laser annealing with elevated temperatures, may result in removing ion irradiation-induced damages and/or amorphization of the respective regions, thus inducing a phase separation of the surface area thermally treated by the laser beam. This phase separation generated in the treated surface area by at least one laser shot, for example two or more laser shots, having sufficient energy density results in a desired 3C—SiC polytype structure. The thus obtained 3C—SiC layer provides a minimum Schottky barrier height with, for example titanium as the metal contact. The band structure for the 3C—SiC polytype with its Fermi level lies in a similar level as the work function of typical contact metals such as, for example, titanium and/or its binary and/or ternary silicides and/or carbides. Those have a work-function within the range of 4.1 to 4.3 eV. Thus, the 3C—SiC layer generated in the irradiated surface region of the semiconductor substrate treated may allow a reliable Ohmic contact with contact materials (e.g., the typically used contact materials), in particular due to the reduced bandgap of the 3C—SiC polytype compared to 4H—SiC or 6H—SiC bandgap structures, thus resulting in a lower contact resistance in the thus obtained Ohmic contacts.

The last act of some of the embodiments is the deposition of a contact material onto the 3C—SiC layer provided before to form a contact layer on the semiconductor substrate. The generation of the 3C—SiC layer at the surface region of the semiconductor substrate facilitates depositing a metal layer onto the 3C—SiC layer, thus resulting in a wide bandgap semiconductor device having a low contact resistance between the metallization and the semiconductor surface. The term "onto" in this regard again means that the metal layer may be deposited directly onto the surface region of the semiconductor substrate or optionally on at least one intermediate layer such as a thin native oxide layer, for example. In some examples, the metal layer comprises a metal content or a content of a metal compound of more than 98%, and/or the metal or the metal compound is selected from the group comprising one, some and/or all of Al, Ti, Cd, Eu, Gd, La, Mn, Nb, Nd, Sc, Zr, Ta, W, Mo, Ni, NiAl, TiN, TaN, MoN, WN, and/or NiSi. Exemplified metal materials are titanium, titanium silicides or carbides, nickel, or nickel silicides due to their work-function match with 3C—SiC polytype's electron affinity.

In some embodiments of the methods, irradiating the surface area of the 4H—SiC substrate with a first thermal annealing laser beam is carried out by laser thermal annealing processing to create a crystalline or polycrystalline 3C—SiC layer. Thus, laser thermal annealing is used to provide the 4H—SiC substrate with a surface region comprising a 3C—SiC layer. The thermal treatment using laser beams with high energy may cause epitaxial rearrangements so that a crystalline or polycrystalline surface layer, mostly comprising 3C—SiC polytype is generated. Generally, the laser thermal annealing process results in a substrate structure with a monocrystalline 4H—SiC layer, a crystalline or polycrystalline 3C—SiC layer with a silicon portion and/or a carbon portion. The high energies used in the thermal annealing processes, for example 3 $J/cm^2$ to 4.5 $J/cm^2$, typically 3 $J/cm^2$ to 4.0 $J/cm^2$, may lead to decomposition reactions within the SiC crystal lattice. Typical laser conditions may be, for example, 3.8 $J/cm^2$ at 308 nm and/or process durations of about 160 ns. Alternative laser systems may be properly adapted when being used for thermal annealing processing according to this disclosure. Thus, the silicon and/or carbon portions generated above the epitaxially treated 3C—SiC surface region are generated by the decomposition products silicon and/or carbon. In these embodiments, most parts or all the silicon and/or the carbon portions will be removed before the depositing of a contact material as described in the former embodiments.

According to some embodiments, the surface area is directly irradiated with the first laser beam. Direct irradiation in this regard means that no further layer is applied to the substrate surface or that any further layer applied to the substrate surface has a minimum absorption of 10% (e.g. %) of the energy of the laser. Those additional layers, if applied, may be transparent layers. Exemplified additional layers may be a heat-trapping or an antireflective layer. Such layers may comprise carbon composed layers which may be automatically generated during the phase separation during the LTA processing.

In some embodiments, the irradiation with the first thermal annealing is carried out with at least two laser shots, also called double shot annealing. At least two laser shots means that after a first shot for partly decomposition of the crystal lattice of the 4H—SiC and/or carrying out amorphization processes therein, a phase separation takes place. In a second laser shot, the thus generated intermediate phase may be recrystallized into a cubic polycrystalline or crystalline 3C—SiC phase. A minimum of two shots may be needed to cause this phase transformation from 4H—SiC to 3C—SiC polymorph under mild conditions, that means lower energy densities during the laser shots. Three or more laser shots or number of pulses are possible but would result in the formation of a thicker 3C—SiC layer and/or more contents of byproducts such as silicon and/or carbon. Therefore, the minimum of two laser shots may be sufficient to achieve a 3C—SiC layer thickness thick enough to produce a reliable Ohmic contact between the semiconductor substrate and/or the contact material with a low contact resistance. Hence, a double shot annealing may be used in the herein described methods for irradiating the semiconductor substrate. Less byproducts may in some examples allow the omitting of the removing act wherein silicon and/or carbon portions are removed before the depositing of the contact material. Such methods are, for example, described in the herein described first embodiment.

Exemplified thicknesses of the 3C—SiC layer generated by the irradiating act may be about 2 to about 50 nm, more particularly 2 to 10 nm, and/or in particular less than 5 nm or less than 3 nm. A thin 3C—SiC layer with a few numbers of crystal layers at the surface of the monocrystalline substrate generally is enough for generating a good Ohmic contact with the contact material directly deposited thereon.

In some embodiments, the removing of most parts of the byproducts, in particular of the silicon and/or carbon portions provided during the generation of the 3C—SiC layer, may be carried out by etching processes or chemical processes suitably used in semiconductor processing. Exemplified etching processes for removing the carbon portion comprises an oxygen plasma etching act. Exemplified processes for the removing of the silicon portion comprises an oxidizing and/or a chemical silicon oxide removing act. In the first act, silicon is oxidized to silicon dioxide and/or in the second act removed by an oxide removing act, for example by diluted HF solution.

Exemplified contact materials used in the depositing act are selected from the group comprising one, some and/or all of a metal, metal silicide, metal carbide, or ternary silicide and/or carbide. In order to provide a good Ohmic contact with the 3C—SiC semiconductor layer at the surface of the semiconductor substrate, the contact material may be selected such that it has a work-function smaller than 4.3 eV, in particularly smaller than 4.1 eV. Particularly exemplified materials are titanium or nickel silicide. For nickel silicide the silicide on the substrate surface may be deposited without carrying out a silicidation reaction using higher temperatures. For example, a sputtering process or vapor deposition process may be used for the depositing the nickel silicide contact material.

In some embodiments, the 4H—SiC semiconductor substrate may be provided with a surface roughness R q of less than 80 nm, for example between about 2 to 50 nm. R q means the root mean square of peaks and valleys on the substrate surface. In tests, it has been found that the formation of Ohmic contacts strongly depends on the initial surface roughness of the substrate. Therefore, the method may comprise, before the act of irradiation, a grinding act wherein the 4H—SiC semiconductor substrate is roughened, thereby inducing crystal damages in the 4H—SiC semiconductor substrate. Alternative grinding acts may include thinning acts in which the SiC substrate may be mechanically eroded and, thus, crystal defects are caused. Those defects in the crystal structure in the semiconductor substrate may facilitate the transformation of the 4H—SiC polytype into the 3C—SiC polytype during the subsequent irradiation act in the surface area of the semiconductor substrate. Facilitating the transformation of the polytypes may include the possibility of reducing the energy density of the used laser beam during the irradiation. More particularly, a lower energy density of the LTA allows a broader process window. At least part of the defects in the crystal structure may be present after the phase separation in the surface area of the semiconductor substrate, that means in the 3C—SiC layer obtained by irradiation or phase separation. Furthermore, such defects can result in deep levels within the bandgap and therefore may effect a further reduction of the contact resistance. Hence, the roughness of the semiconductor substrate can be used to adjust the Ohmic contact and, more particularly, may be used to further lower the contact resistance at the interface between the semiconductor substrate and the contact material.

In some examples, the Ohmic contact may be improved by irradiating the contact layer by a second laser thermal annealing pulse on the contact material contacting the 3C—SiC layer. In particularly, such a second laser thermal annealing pulse may be used after the deposition of the contact material and/or the realization of the Ohmic contact between the contact material and the 3C—SiC semiconductors substrate. It is assumed that this additional thermal annealing pulse is able to lower the contact resistance by improving the crystal structure at the interface.

Moreover, the method may comprise depositing at least one further metal layer on the contact layer. In case of a titanium or nickel silicide contact material layer, additional layers may comprise titanium, nickel, vanadium, and/or silver components which may include also mixed metal layers such as nickel vanadium layers. A typical metal contact stack may comprise a titanium contact layer, a mixed nickel vanadium layer, and/or a silver layer, which may, in some examples, be provided in this order on the semiconductor substrate.

The methods as described before may be used to prepare silicon carbide semiconductor devices. Accordingly, the silicon carbide semiconductor devices obtainable or obtained therewith may fall within the herein described products. Some embodiments of silicon carbide semiconductor devices comprise a 4H—SiC semiconductor substrate, a 3C—SiC layer, and/or a contact layer (directly, for example) in contact with the 3C—SiC layer at the semiconductor substrate surface. In these semiconductor devices, good Ohmic contacts may be realized due to the presence of 3C—SiC at the interface between the semiconductor substrate and the contact material. The thus obtained Ohmic contacts enable a good reliability of the contact resistance even if a silicidation act is not carried out as in common manufacturing processes of Ohmic contacts. As explained above, if NiSi is used as contact material, it shall be deposited by a sputtering method instead of thermal annealing. Thus, high temperatures within the semiconductor device in the final act of manufacturing may be avoided. Moreover, an additional backside doping process is also not required, because the 3C—SiC bandgap enables a very good Ohmic contact for typical substrate doping levels. Moreover, since the contact material is directly provided at the surface of the semiconductor substrate, carbon clusters can be avoided or are at least mostly removed before the deposition of the contact material. Thus, the contact material has a good adhesion on the semiconductor substrate surface. Accordingly, the semiconductor devices as described herein may provide a good and/or reliable Ohmic contact. The contacts obtained may play a significant role in providing semiconductor devices with contacts having a good stability and/or overall performance.

Exemplified semiconductor devices with device structures as described herein are power-MOSFETs or diodes. In such semiconductor devices the 3C—SiC layer typically is a n-type or p-type epitaxial or polycrystalline layer. N-doped source zones and/or p-doped body or emitter zones may be prepared at the front side and/or highly n-doped contact layers may be prepared at the backside depending on the semiconductor device produced.

In some embodiments described herein, the metal layer used as the contact layer comprises a metal content or a content of a metal compound of more than 98%, and/or the metal or metal compound is selected from the group comprising one, some and/or all of of Al, Ti, Ta, W, Mo, Ni, NiAl, TiN, TaN, MoN, WN, and/or NiSi. Titanium may be used as contact material in direct contact to the semiconductor surface because of its work function which is similar to the bandgap of 3C—SiC. Metal compounds typically are metal nitrides or metal silicides but may also comprise other nonmetal components. In case of NiSi, the Si content is less than 15%, particularly, about 10 to 12%, and/or more particularly about 11%.

In some embodiments, the semiconductor device comprises at least one further metal layer which is deposited above the contact layer. Similar materials as described above may be used. NiV or Ag are examples of metal components or compounds suitably adapted for the use as additional metal layers together with a titanium contact layer at the interface to the semiconductor substrate. Silver is often used as contact material for connections of the semiconductor devices to the interconnections.

Some embodiments of the silicon carbide semiconductor devices as described herein may have such a contact layer as backside contact. In some embodiments, the semiconductor substrate may comprise several devices structures at the frontside surface. The manufacturing methods described herein allow the production of an Ohmic contact in an efficient and/or cost sensitive manner. The thus obtained SiC based semiconductor devices are produced with reliable Ohmic contacts.

The above-described embodiments will be further described by referring to the drawings which show specific examples of the methods and/or semiconductor devices obtained therewith. Referring now to FIGS. 1 to 4, a method of manufacturing an exemplary embodiment of a semiconductor device has been shown. FIG. 1 illustrates a cross-sectional view of a SiC monocrystalline SiC substrate layer 10 made, for example, mainly from a 4H—SiC material. In a further act of the herein described exemplified method, an irradiation of the surface area of the substrate 10 is carried out by irradiation with an annealing laser beam to create a 3C—SiC layer 20 within a surface region of the substrate. In order to generate a thin 3C—SiC layer within the surface region of the substrate, the energy density of the laser beam is adjusted such that a modification of the crystal structure takes place and/or at least a 3C—SiC phase appears at the surface region of the substrate. Sometimes, two or more laser pulses may be applied to achieve the restructuring of the crystal structure from hexagonal to a cubic structure.

Once the 3C—SiC layer has been provided at the surface area of the 4H—SiC substrate, a contact material 30 is deposited above the substrate stack including the substrate 10 and/or the 3C—SiC layer 20 as it is shown in FIG. 3. In this example a titanium layer 30 has been deposited above the 3C—SiC layer 20 because of the similarity of the work function of titanium to the electron affinity of the 3C—SiC polytype. This allows the manufacturing of a contact on a silicon carbide semiconductor substrate in an easy way. No additional annealing acts or thermal treatments are necessary. Thus, this manufacturing method is particularly suitable for producing backside contacts on a semiconductor device with temperature labile device structures at the frontside of the substrate, for example.

In the herein exemplified manufacturing method, the contact material such as titanium can be directly provided above the 3C—SiC surface area of the semiconductor substrate without the need of any silicidation reaction or high dopant concentration in the surface regions of the substrate. As the content of carbon at the surface region is low or no carbon is present at all, the adhesion of the contact material is good. Hence, the reliability of the contact obtained is improved.

In FIG. 4, the semiconductor device 100 with a stack of the 3C—SiC layer 20, the contact material layer 30, and/or an additional metal layer 35 above the 4H—SiC substrate 10 is shown in its cross-section. The semiconductor device 100 has been produced in line with the method as described in FIGS. 1 to 3 and/or by depositing at least one additional metal layer 35 above the contact material layer 30. The additional metal layer 35 may comprise a nickel vanadium layer and/or a silver layer provided in this order on the contact material layer 30 made of titanium. The layers 30 and/or 35 may form the contact stack.

The FIGS. 5 to 9 illustrate another example of a manufacturing method of a contact on a silicon carbide semiconductor substrate. A 4H—SiC substrate is provided in the first act as shown in FIG. 5. A thermal annealing with a double shot laser beam irradiation process is carried out in the surface region of the semiconductor substrate. By using a double shot of laser, a phase separation of the 4H—SiC polytype can be generated at suitable energy levels. As shown in the cross-section in FIG. 6, the phase separation generates a stack of a 3C—SiC layer 20, a silicon layer 22 or at least silicon portions above the layer 20, and/or a carbon layer 24 or at least carbon portions above the layer 22 above the semiconductor substrate 10. In the next act, the carbon layer 24 is removed by an oxygen plasma etching treatment (see FIG. 7). In the following, the produced silicon layer 22 is removed by an oxidizing treatment to generate silicon oxides, followed by an HF etching of the silicon oxides (see FIG. 8). The thus obtained 3C—SiC layer 20 is mostly free of the removed carbon and/or silicon portions generated as byproducts during the phase separation of the substrate surface during the irradiation process. As to the good adjustability of the energy doses applied to the surface region of the semiconductor substrate, the layer 20 can be generated in a thickness of about less than 10 nm, in this example of about 2-4 nm. The thickness of at least 2 nm is enough for providing the surface area with a crystal structure suitable for providing a good Ohmic contact with the titanium contact layer to be provided in the next act. The realization of such thin 3C—SiC layers has the advantage, that there is only a small contribution of the reduced mobility in these 3C—SiC layers to the total on-state resistance of the final device. Above the 3C—SiC layer 20 the contact material layer 30 is deposited as described with regard to FIG. 3, thus manufacturing the semiconductor device as shown in FIG. 9. A typical deposition method for the contact material is sputtering of titanium onto the backside surface of the semiconductor substrate. Additional metal layers as shown in the example shown in FIG. 4 may be applied onto the contact material layer 30 even if this is not shown in this example.

The above illustrated manufacturing method of a contact on a monocrystalline SiC semiconductor substrate allows the fabrication of a reliable Ohmic contact without the need of additional thermal processes. The removal of the carbon portions may increase the adhesion of the contact material on the semiconductor substrate surface at the interface which may cause problems in the state of the art. As the work-function of titanium is similar to the band gap of the 3C—SiC polytype, a silicidation process like in conventional manufacturing methods is not necessary to provide a good Ohmic contact. Hence, the overall manufacturing process may be easier and/or may result in improved reliability of the obtained silicon carbide semiconductor devices.

Terms such as “first”, “second”, and the like, are used to describe various embodiments, layer, order of acts, etc. and are also not intended to be limiting. Like terms refer to like elements throughout the description.

As used herein, the terms “having”, “containing”, “including”, “comprising” and the like are open ended terms that indicate the presence of stated elements or features, but do not preclude additional elements or features. The articles “a”, “an” and “the” are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments and examples shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A method for manufacturing a contact on a silicon carbide semiconductor substrate, the method comprising:

providing a 4H—SiC semiconductor substrate;

directly irradiating a surface area, having a crystalline structure, of the 4H—SiC semiconductor substrate with a first thermal annealing laser beam to generate a phase separation of the surface area comprising at least a 3C—SiC layer; and depositing a contact material onto the 3C—SiC layer to form a contact layer on the 4H—SiC semiconductor substrate.

2. The method of claim 1, wherein before irradiation with the first thermal annealing laser beam:

no further layer is applied to the 4H—SiC semiconductor substrate.

3. The method of claim 1, wherein before irradiation with the first thermal annealing laser beam, a second layer applied to the 4H—SiC semiconductor substrate has a maximum absorption of 10%.

4. The method of claim 3, wherein the second layer is at least one of a heat-trapping layer or an antireflective layer.

5. The method of claim 1, wherein the irradiation with the first laser thermal annealing laser beam is a double shot annealing.

6. The method of claim 1, wherein the contact material comprises at least one of a metal, metal silicide, metal carbide, or ternary silicide and carbide.

7. The method of claim 1, wherein the contact material has a work-function smaller than 4.1 eV.

8. The method of claim 1, wherein the contact material is titanium or nickel silicide.

9. The method of claim 1, wherein the 4H—SiC semiconductor substrate has a surface roughness Rq of less than 80 nm.

10. The method of claim 1, wherein before irradiation, the 4H—SiC semiconductor substrate is roughened with grinding to induce crystal damages in the 4H—SiC semiconductor substrate.

11. The method of claim 1, wherein the contact layer is irradiated by a second laser thermal annealing pulse on the contact material contacting the 3C—SiC layer.

12. The method of claim 1, wherein a second metal layer is deposited on the contact layer.

13. The method of claim 1, wherein the crystalline structure of the surface area is a monocrystalline structure.

14. The method of claim 1, wherein the 3C—SiC layer has a polycrystalline structure.

15. A method for manufacturing a contact on a silicon carbide semiconductor substrate, the method comprising:

providing a 4H—SiC semiconductor substrate;

directly irradiating a surface area, having a crystalline structure, of the 4H—SiC semiconductor substrate with a first thermal annealing laser beam to generate a phase separation of the surface area comprising at least a 3C—SiC layer comprising a silicon portion and a carbon portion;

removing at least some of the silicon portion;

removing at least some of the carbon portion; and depositing a contact material onto the 3C—SiC layer to form a contact layer on the 4H—SiC semiconductor substrate.

16. The method of claim 15, wherein the removing at least some of the carbon portion is performed via an oxygen plasma etching treatment.

17. The method of claim 15, wherein the removing at least some of the silicon portion is performed via an oxidizing treatment.

18. A silicon carbide semiconductor device, comprising a 4H—SiC semiconductor substrate;

a 3C—SiC layer; and a contact layer in contact with the 3C—SiC layer at a surface of the 4H—SiC semiconductor substrate, wherein the contact layer is a backside contact.

19. The silicon carbide semiconductor device of claim 18, wherein a second metal layer is deposited above the contact layer.

20. The silicon carbide semiconductor device of claim 18, wherein the 4H—SiC semiconductor substrate comprises a plurality of device structures at a frontside surface.

* * * * *